United States Patent
Roth et al.

(10) Patent No.: US 6,504,246 B2
(45) Date of Patent: *Jan. 7, 2003

(54) INTEGRATED CIRCUIT HAVING A BALANCED TWIST FOR DIFFERENTIAL SIGNAL LINES

(75) Inventors: Alan S. Roth, Austin, TX (US); Jon D. Baney, Lockhart, TX (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/415,493

(22) Filed: Oct. 12, 1999

(65) Prior Publication Data

US 2002/0056912 A1 May 16, 2002

(51) Int. Cl.[7] .......................... H01L 27/10; H01L 23/48
(52) U.S. Cl. ...................... 257/750; 257/208; 257/211; 257/776
(58) Field of Search ................................ 257/903, 904, 257/920, 776, 773, 208, 211, 250; 565/185; 365/69

(56) References Cited

U.S. PATENT DOCUMENTS

| | | | | |
|---|---|---|---|---|
| 4,977,542 A | * | 12/1990 | Matsuda et al. | 365/207 |
| 5,010,524 A | * | 4/1991 | Fifield et al. | 365/205 |
| 5,062,077 A | * | 10/1991 | Takashima et al. | 365/69 |
| 5,140,556 A | * | 8/1992 | Cho et al. | 365/207 |
| 5,144,583 A | * | 9/1992 | Oowaki et al. | 365/206 |
| 5,216,634 A | * | 6/1993 | Takano et al. | 365/205 |
| 5,416,734 A | * | 5/1995 | Hidaka et al. | 365/63 |
| 5,534,732 A | * | 7/1996 | Debrosse et al. | 257/776 |
| 5,821,592 A | | 10/1998 | Hoenigschmid et al. | 257/390 |
| 5,864,181 A | | 1/1999 | Keeth | 257/776 |
| 5,864,496 A | * | 1/1999 | Mueller et al. | 365/69 |
| 5,901,088 A | | 5/1999 | Kraus | 365/185.21 |

\* cited by examiner

*Primary Examiner*—Eddie Lee
*Assistant Examiner*—Joseph Nguyen
(74) *Attorney, Agent, or Firm*—Daniel D. Hill

(57) ABSTRACT

A balanced twist design for differential small signal pairs which is balanced in terms of resistance, capacitance and process variance. In the twist design of the present invention, each routing (6, 10) passes through two layers of metal. In addition, each routing (6, 10) passes through the same number of vias (9, 13, 14, 15), and experiences the same number of bends. Each routing (6, 10) is also exposed to the same sidewall crosstalk since the length and width of each routing (6, 10) in both metal layers is approximately the same. As a result, the new twist design reduces signal degradation, enhances signal separation, and allows increased clock speed of the integrated circuit.

12 Claims, 4 Drawing Sheets

INTEGRATED CIRCUIT HAVING A BALANCED TWIST FOR DIFFERENTIAL SIGNAL LINES

FIELD OF THE INVENTION

This invention relates generally to integrated circuits, and more particularly to balancing differential signal lines in integrated circuits.

RELATED ART

Integrated circuit static random access memories (SRAMs) are used in a variety of applications today. In particular, high speed synchronous SRAMs are used in such applications as caches for computer systems, workstations, and the like. These cache memories provide a high-speed storage of data or instructions that are likely to be reused. As integrated circuit technology, has improved, microprocessors have correspondingly increased in speed. As microprocessor speed increases, the access time of the SRAMs must decrease to provide efficient cache storage.

The supply voltage of SRAMs to is being lowered to reduce energy consumption and the generation of heat. For example, some SRAMs operate with a supply voltage of about 1.8 volts. As a result, the voltage differential on the bit line pairs is becoming increasingly low. The importance of signal separation on the bit lines to maintain margins and reliability is thus heightened.

SRAMs and other memory products typically have long differential pairs of signal lines or bit lines configured over an array of memory cells. A problem arises wherein these differential pairs experience crosstalk due to the sidewall coupling with adjacent differential pairs and with the underlying substrate. This crosstalk results in decreased performance, degradation in signal separation, and reduction in speed.

One approach to reduce the signal degradation due to crosstalk has been to twist the differential pairs at intervals to expose each routing of the pair to the same capacitive coupling. A problem with the traditional approach of twisting metal routings, however, is that in each twist, one signal transitions between multiple layers of metal while the other does not. Each layer of metal may have different resistivities. In addition, each twist requires the signal on one routing to pass through a via, which may have a different resistivity as well. These transitions cause resistive and capacitive imbalances in the differential pair, which may also result in signal degradation and reduced signal separation.

In order to compensate for the undesirable effects of the traditional twist design, one could add additional twists. This solution is not suitable to many applications such as memory devices, however, since many bit cells will be followed by an odd number of twists, resulting in asymmetry and many of the same problems associated with a single traditional twist.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Generally, the present invention provides for twisting differential pairs to reduce the effects of capacitive coupling and to equalize, or balance, the resistance of the differential pairs. The present invention provides a twist configuration that is balanced in terms of resistance, capacitance, and process variance. In the twist design of one embodiment of the present invention, each routing, or line, in the area of the twist passes through both layers of metal. In addition, each routing passes through the same number of vias, and may experience the same number of bends. Each routing will be exposed to the same sidewall crosstalk with adjacent lines since the length of each routing along each sidewall in the same plane is approximately the same. In some embodiments, twisting differential pairs as disclosed herein reduces signal degradation, enhances signal separation, and thus allows a higher clock speed for the integrated circuit.

Figure 1:
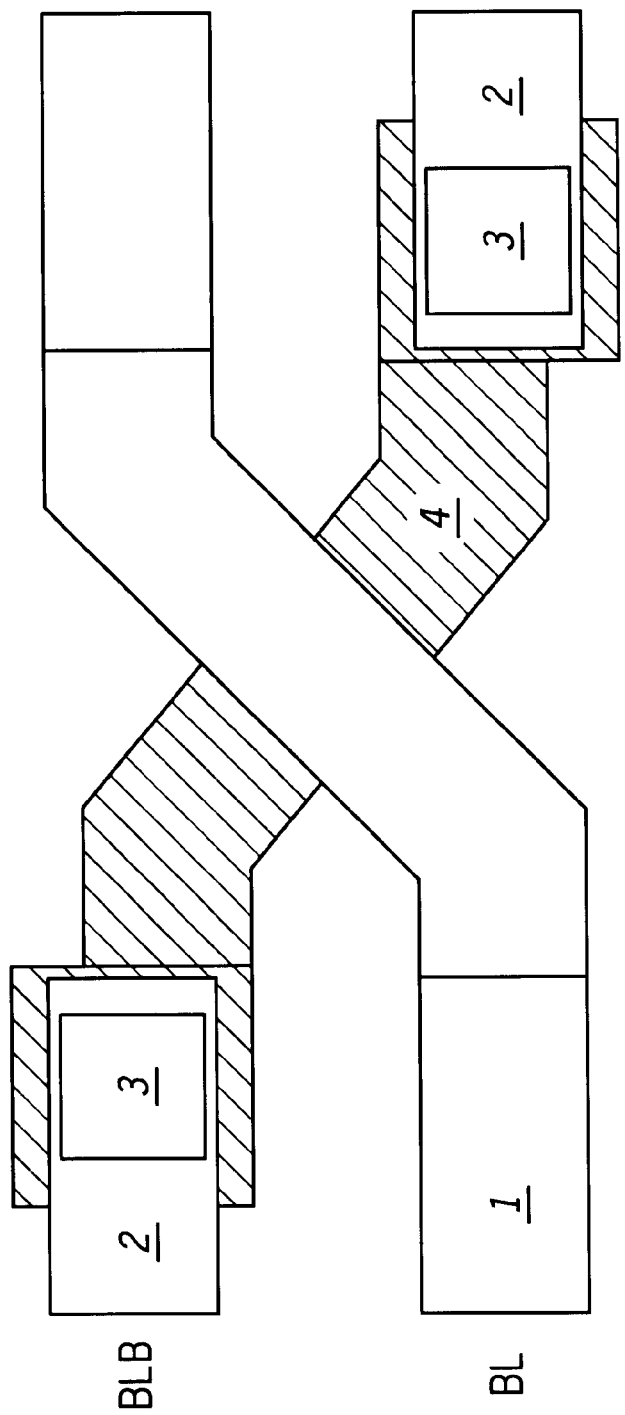
FIG. 1 illustrates a prior art twist of a differential pair.

FIG. 1 illustrates a prior art layout in which the routings of a differential pair of signal lines are twisted. A first routing 1 of the differential pair carries signal BL (bit line). The second routing 2 carries signal BLB (bit line bar), and is shunted to a first metal layer 4 with vias 3. As can be seen, only the second routing 2 is in contact with the vias 3, and is shunted to lower metal layer 4. The presence of vias 3 and the lower metal layer 4 induces additional resistance in the signal path of BLB that is not present in the signal path of BL. Also, because a portion of BLB is in a lower metal layer and closer to the active circuitry of the integrated circuit, a capacitive coupling between BLB and the underlying substrate that is greater than the capacitive coupling between BL and the underlying substrate. This asymmetrical configuration may result in resistive and capacitive imbalances in the differential pair, and may also result in signal degradation, reduced signal separation, and higher access times.

Figure 2:
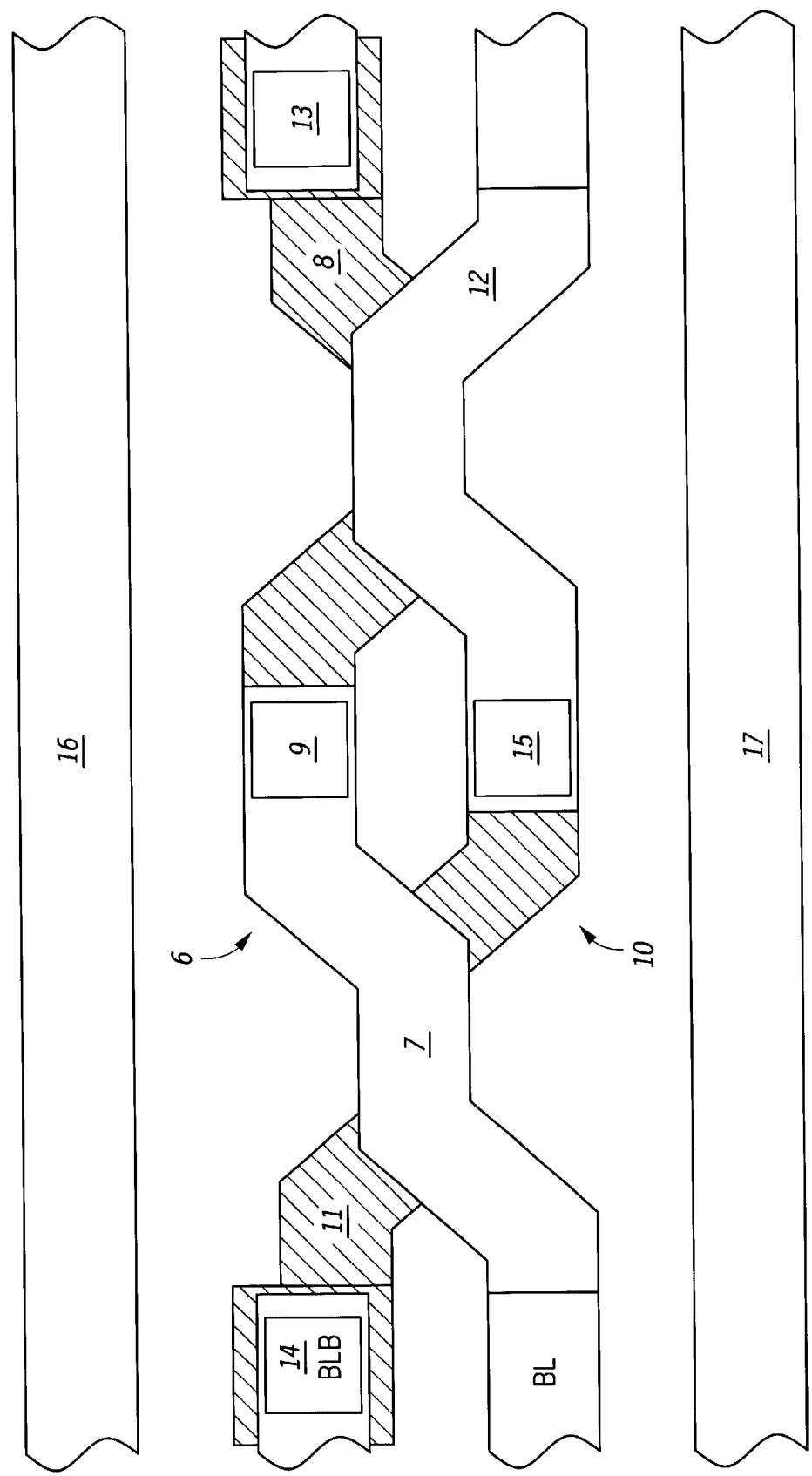
FIG. 2 illustrates one embodiment of a twist of a differential pair in accordance with the present invention.

FIG. 2 illustrates one embodiment of a twist configuration of a differential pair in accordance with the present invention. Signal lines BL and BLB carry differential signals in, for example, an integrated circuit memory and may be only two of many such signal lines that run parallel to each other for a relatively long distance. As can be seen in FIG. 2, the first routing 6 carries signal BL, and contains a first length 7 disposed on a second metal layer between via 14 of line BLB and via 9. Note that in the description of this embodiment, the terms "first" and "second" in reference to layers are used to refer to lower and upper metal layers, respectively. Also, the metal used to form the first metal layer and the second metal layer may include aluminum or copper. The metal layers are separated by a dielectric layer. Via 9 connects the first length 7 to a second length 8 disposed on a first metal layer. Via 13 connects the second length 8 to the remainder of the routing disposed in the second metal layer.

The second routing 10 carries the complement signal BLB. Vias 14 and 15 shunt, or connect, second routing 10 to a first length 11 on the first metal layer, and back to a second length 12 on the second metal layer. As can be seen from inspection of FIG. 2, both first routing 6 and second routing 10 have substantially equal lengths disposed in each metal layer. Routing 6 and 10 also have parallel lines 16 and 17 running adjacent to them. Both first routing 6 and second routing 10 also contain two vias and have a portion that runs for equal lengths in the first metal layer to balance a relative resistance of the two metal lines. In addition, both first routing 6 and second routing 10 are exposed to each routing 16 and 17 along equal lengths in the same plane. In this way, the effects of sidewall capacitive coupling, as well as the effects of capacitive coupling with the underlying substrate, can be diminished or negated.

In the embodiment shown in FIG. 2, each length of the routing also contains an equivalent number of bends. For example, lengths 7 and 11 both contain 4 bends, as do lengths 8 and 12. In this way, undesirable effects due to process variation can be minimized.

Also in reference to FIG. 2, it should be noted that because both first routing 6 and second routing 7 have substantially equal lengths and widths disposed in each metal layer, each is exposed to approximately the same capacitive coupling from the adjacent upper and lower planes, reducing undesirable effects associated with capacitive differences between layers of the integrated circuit. Also, any difference in resistivity between the two metal layers is balanced having the lines run for the same distance in the first metal layer and the second metal layer.

Note that in FIG. 2, the routings are disposed primarily in an upper, second metal layer, and are shunted to a lower, first metal layer to accomplish a twist. If one were to view a horizontal cross section of the configuration, one would see that the routing projects downwardly into the first metal layer at the twists. Although the invention has been described with respect to twisting wherein the routing is shunted to a lower metal level, persons of ordinary skill in the art will appreciate that the vertical direction of the twist is arbitrary and may be accomplished in the other direction.

Figure 3:
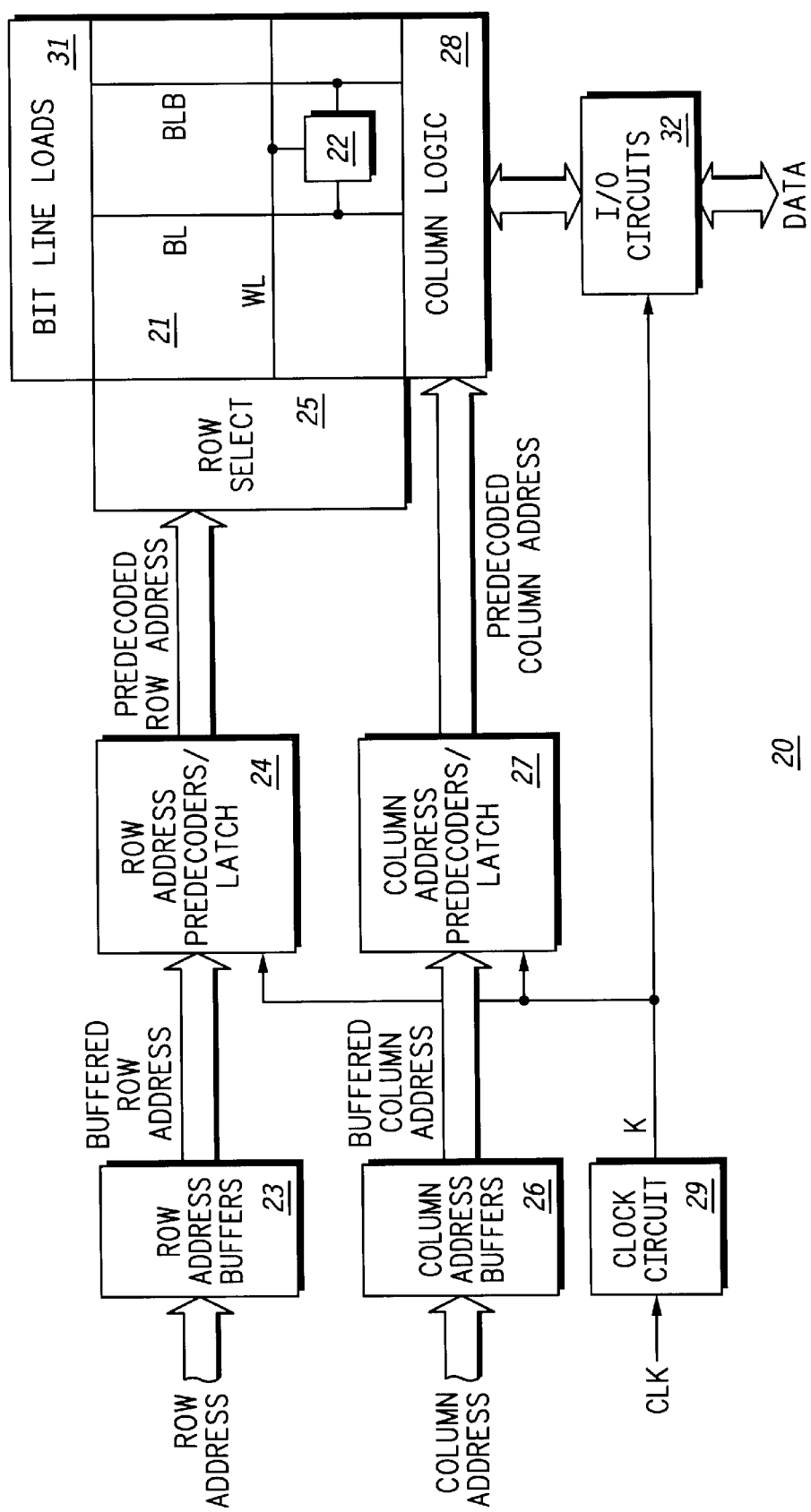
FIG. 3 illustrates, in block diagram form, an integrated circuit memory in which includes bit lines that are twisted as illustrated in FIG. 2.

FIG. 3 illustrates, in block diagram form, an integrated circuit memory in which includes bit lines that are twisted as illustrated in FIG. 2. Memory 20 is a synchronous integrated circuit SRAM implemented in CMOS. A CMOS integrated circuit is a circuit that includes multiple CMOS (complementary metal-oxide semiconductor) transistors on the same integrated circuit. Memory 20 includes memory array 21, row address buffers 23, row address predecoders/latch 24, row select circuits 25, column address buffers 26, column address predecoders/latch 27, column logic 28, clock circuit 29, bit line loads 31, and data input/output (I/O) circuits 32.

Memory array 21 includes a plurality of memory cells, such as memory cell 22, organized in rows and columns. A word line and the memory cells coupled to the word line comprise a row of memory cells. A bit line pair and the memory cells coupled to the bit line pair comprise a column of memory cells. Each memory cell is a conventional six transistor SRAM cell using P-channel transistors as pull-up devices. However, the memory cells may also be four transistor SRAM cells using polysilicon load resistors as pull-up devices instead of p-channel transistors. A memory cell is located at each intersection of the word lines and the bit line pairs. For example, memory cell 22 is coupled to a word line labeled "WL", and to a bit line pair labeled "BL" and "BLB". The memory cells of array 21 are addressable through row decoding and column decoding, and each memory cell has a unique address at an intersection of a row and a column. Each word line is coupled to row select circuits 25, and each bit line is coupled between bit line loads 31 and column logic 28.

Row address buffers 23 have a plurality of first input terminals for receiving a row address labeled "ROW ADDRESS", and a plurality of output terminals for providing buffered row address signals labeled "BUFFERED ROW ADDRESS". Row address predecoders/latch 24 has a plurality of first input terminals for receiving buffered row address signals BUFFERED ROW ADDRESS, a second input terminal, and a plurality of output terminals for providing predecoded row address signals labeled "PREDECODED ROW ADDRESS".

Column address buffers 26 have a plurality of first input terminals for recieving a column address labeled "COLUMN ADDRESS", and a plurality of output terminals for providing buffered column address signals labeled "BUFFERED COLUMN ADDRESS". Column address predecoders/latch 27 has a plurality of first input terminals for receiving buffered column address signals BUFFERED COLUMN ADDRESS, a second input terminal, and a plurality of output terminals for providing predecoded column address signals labeled "PREDECODED COLUMN ADDRESS". Note that the amount of decoding and predecoding may be different in other embodiments, and is not important for describing the invention.

Clock circuit 29 has a first input terminal for receiving an external clock signal labeled "CLK", and an output terminal coupled to the row address predecoders/latch 24, column address predecoders/latch 27, and to I/O circuits 32 for providing an internal clock signal labeled "K." In addition, the clock signal may be routed to other portions of memory 20 which are not shown in FIG. 3, but may be necessary for providing synchronous operation. Note that clock signal K is a differential signal, however, only the true portion of differential clock signal K is illustrated in FIG. 3.

Data I/O circuits 32 have a first plurality of terminals for providing and for receiving data signals labeled "DATA", and a second plurality of terminals coupled to column logic 28.

To read a data bit from a memory cell, such as memory cell 22, row address ROW ADDRESS is provided to row address buffers 23, and column address COLUMN ADDRESS is provided to column address buffers 26. The row and column addresses are latched in row and column predecoders/latch 24 and 27, respectively, in response to a rising edge of clock signal K, and the latched predecoded row and column addresses are provided to row select 25 and column logic 28 to select a word line and a bit line pair. Word line drivers (not shown) drive the voltage of the word line to a logic high, which selects the row of memory blocks. Column logic 28 couples bit line pair BL/BLB to a sense amplifier (not shown). The data bit stored in the selected memory cell exists as a relatively small differential voltage on the pair of complementary bit lines. The sense amplifier detects and amplifies the differential voltage and communicates it to I/O circuits 32. With a power supply voltage of about 1.8 volts, the differential voltage on the bit line pair may be 20 mV or lower. At these low voltages, any imbalance in the relative resistance and capacitive coupling of the bit lines of a bit line pair can cause reduced noise margins and may require more time for adequate signal separation. Also, in a memory that uses the twist illustrated in FIG. 1, the unequal resistance in the bit lines may cause the sense amplifier to initially amplify the small differential voltage on the bit line pair in the wrong direction before it recovers and amplifies in the correct direction, resulting in increased access time of the memory. This imbalance in resistance can be compensated for using the twist design illustrated in FIG. 2.

During a write cycle of memory 20, the flow of data is essentially reversed. Row address ROW ADDRESS is provided to row address buffers 23, and column address COL- UMN ADDRESS is provided to column address buffers 26. The row and column addresses are latched in row and column predecoders/latch 24 and 27, respectively, in response to a rising edge of clock signal K, and the latched predecoded row and column addresses are provided to row select 25 and column logic 28 to select a word line and a bit line pair. Word line drivers (not shown) drive the voltage of the word line to a logic high, which selects the row of memory cells. A data signal DATA is provided to I/O circuit 32, which provides a corresponding data signal to a selected bit line pair. A voltage differential is driven onto the selected bit line pair which writes a data bit into the memory cell, such as memory cell 22. At the end of the write cycle the differential voltage on the bit line pair is reduced to a level small enough to prevent data from being erroneously written into a memory cell during the following read cycle. Equalization and precharge (write recovery) of the bit line pairs is achieved by bit line loads 31.

Figure 4:
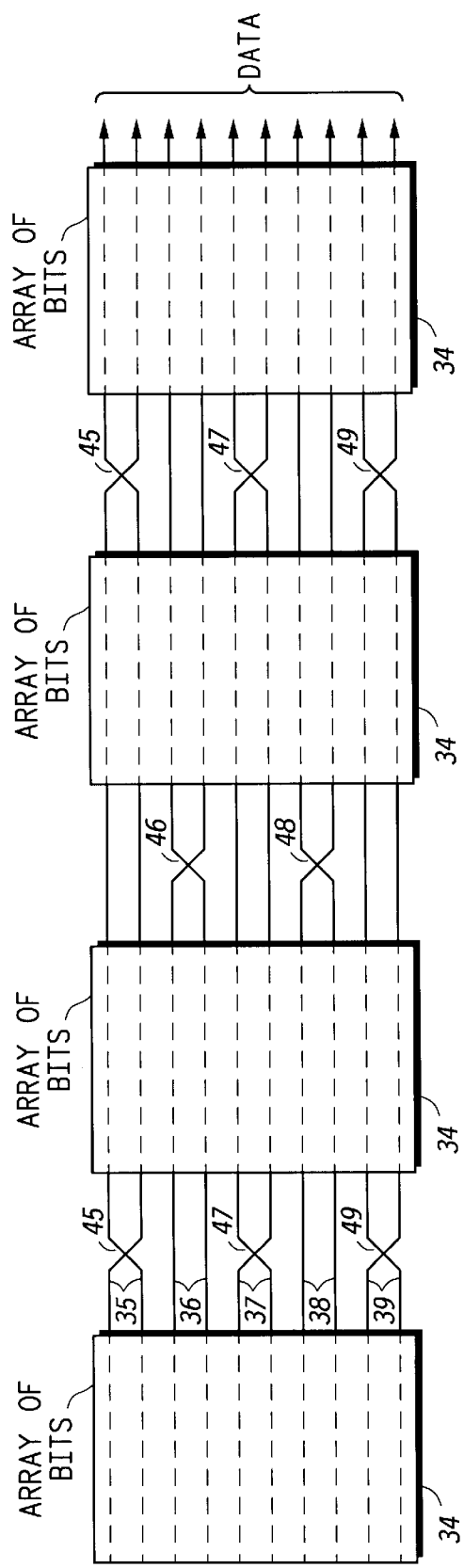
FIG. 4 illustrates a more detailed view of the memory array in the memory device depicted in FIG. 3.

The memory array 21 is shown in greater detail in FIG. 4. Memory array 21 contains a number of memory blocks 34. Each memory block 34 contains an array of bits; in one configuration, each memory block has 256×72 bits. A plurality of differential pairs 35, 36, 37, 38, and 39 traverse all of memory blocks 22 and couple to the memory cells of the blocks. Though only five differential pairs, or bit line pairs, are depicted for purposes of this discussion, it will be appreciated that many more differential pairs are typically present in modern devices. Each of the differential pairs 35, 36, 37, 38, and 39 may experience crosstalk due to capacitive coupling with adjacent pairs. As discussed above, the differential pairs 35, 36, 37, 38, and 39 have periodic twists 45, 46, 47, 48, and 49 as discussed above and illustrated in FIG. 2 to balance and negate the effects of capacitive coupling.

In the illustrated embodiment, the area between each of the memory blocks is used for twisting the bit line pairs as illustrated in FIG. 2. Twisting the bit line pairs as illustrated in FIG. 2 requires more area between the memory blocks than the prior art twist illustrated in FIG. 1. Referring back to FIG. 2, to decrease the amount of area needed for twisting and still have the required length running in the first metal layer, bit lines 6 and 10 are "bent" in the portion between vias 9 and 13. Each bit line has the same number of bends to insure a resistance of each bit line is about the same. The number of bends in the bit lines between vias 9 and 13 is the same as the number of bends in the bit lines between vias 14 and 15. In this manner, any process variation between the first metal layer and the second metal layer is compensated for. Note that in the plan view, each bit line is essentially a mirror image of the other. In other embodiments, if there is sufficient space between memory blocks 34, the portion of both bit lines between vias 9 and 13 may be straight, or have no bends, to achieve about the same balanced resistance and capacitance between adjacent bit lines. Also in other embodiments, the twist as illustrated in FIG. 2 may be formed over a memory array in embodiments that have sufficient space between memory cell connections to the bit lines.

In an integrated circuit memory that uses twisted bit lines, some of the differential pairs may have an even number of twists and some may have an odd number of twists. If the twisting is done as illustrated in the prior art FIG. 1, the relative resistance of the lines depends upon whether the number of twists is even or odd. However, when the twist is implemented as illustrated in FIG. 2, a resistance of each line of a differential pair will be the about the same whether the number of twists is even or odd.

Although the invention has been described with respect to specific memory devices, those of ordinary skill in the art will appreciate that the invention may also be used in connection with other memory devices such as, for example, DRAMs, microprocessors containing cache memory, and other data processing devices that have a number of long signal metal lines in parallel.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit, comprising:
    a first metal layer for forming metal signal lines;
    a second metal layer separated from the first metal layer for forming metal signal lines; and
    a first signal line and a second signal line implemented in the second metal layer, the first signal line being parallel to the second signal line to form a signal line pair;
    wherein the first signal line crosses to an opposite side of the second signal line via a first portion implemented in the first metal layer to form a twist in the signal line pair to balance a capacitive coupling between the first and second signal lines, the first portion having a resistance value, wherein the second signal line having a second portion implemented in the first metal layer, the second portion having a length and width that are substantially the same as a length and width of the first portion, and the second portion having substantially the same resistance value as the first portion, the first and second portions coupled to their respective bit lines using vias, and wherein the second portion for balancing an overall relative resistance between the first and second signal lines.

2. The integrated circuit of claim 1, wherein the first portion and the second portion have the same number of bends.

3. The integrated circuit of claim 1, wherein the first and second signal lines are characterized as being a bit line pair coupled to a memory cell in a memory array.

4. The integrated circuit of claim 3, wherein the memory cell is a static random access memory cell and the integrated circuit is a stand alone static random access memory.

5. The integrated circuit of claim 1, wherein the first and second signal lines have the same number of vias for coupling between the first and second metal layers.

6. An integrated circuit memory, comprising:
    a memory array having more than one memory cell coupled to a bit line pair, the bit line pair having a first bit line and a second bit line;

a column logic circuit, coupled to the first bit line and the second bit line, for coupling the first and second bit lines to a sense amplifier during a read cycle of the integrated circuit memory;

a first metal layer for forming metal signal lines;

a second metal layer separated from the first metal layer for forming metal signal lines; and the first bit line and the second bit line being implemented in parallel in the second metal layer over the memory array, a twist is formed in the bit line pair in an area outside of the memory array, wherein the first bit line having a first portion crossing to the other side of the second bit line via the first metal layer, and the first bit line continuing parallel to the second bit in the second metal layer, and wherein the second bit line having a second portion implemented in the first metal layer, the second portion being the same length and width as the first portion, and the second portion having a resistance value that is substantially the same as a resistance value of first portion, and wherein the first and second portions coupled to their respective bit lines using vias, the first and second portions for balancing a capacitive coupling between the first and second bit lines and for causing an overall relative resistance of the first and second bit lines to be equal.

7. The integrated circuit memory of claim 6, wherein the second metal layer is disposed above the first metal layer.

8. The integrated circuit memory of claim 6, wherein the first and second bit lines have the same number of vias for coupling the first metal layer to second metal layer.

9. The integrated circuit memory of claim 6, wherein first portion has the same number of bends as the second portion.

10. The integrated circuit memory of claim 6, wherein the memory array is divided into more than one memory block, the first portion and the second portion being implemented between adjacent memory blocks.

11. The integrated circuit memory of claim 6, wherein the integrated circuit memory is a static random access memory.

12. The integrated circuit memory of claim 6, wherein the first and second metal layers are formed using a metal selected from the group consisting of aluminum and copper.

* * * * *